United States Patent [19]

Okoro

[11] Patent Number: 6,066,983
[45] Date of Patent: May 23, 2000

[54] PCS MULTI-CARRIER LINEAR POWER AMPLIFIER

[75] Inventor: Jeremiah Okoro, Morris County, N.J.

[73] Assignee: AT&T Corp, New York, N.Y.

[21] Appl. No.: 09/217,788

[22] Filed: Dec. 21, 1998

[51] Int. Cl.[7] .................................................... H03F 1/26
[52] U.S. Cl. ...................... 330/149; 330/124 R; 455/126
[58] Field of Search .............................. 330/149, 124 R, 330/53, 1, 24 D, 295; 455/126

[56] References Cited

U.S. PATENT DOCUMENTS

| | | | |
|---|---|---|---|
| 4,064,464 | 12/1977 | Morse | 330/124 R |
| 4,238,855 | 12/1980 | Zborowski | 330/149 |
| 5,610,556 | 3/1997 | Rubin | 330/124 R |
| 5,781,066 | 7/1998 | Parisi et al. | 330/124 R |
| 5,796,306 | 8/1998 | Tsumura | 330/124 R |
| 5,872,481 | 2/1999 | Sevic et al. | 330/124 R |
| 5,973,559 | 10/1999 | Alberty | 330/124 R |

*Primary Examiner*—Robert Pascal
*Assistant Examiner*—Khanh Van Nguyen

[57] ABSTRACT

An RF power amplifier includes a first monitoring circuit that is coupled to an output signal of the power amplifier, and generates a first control signal based on a level of intermodulation distortion in the output signal. The first control signal has a first value when the level of intermodulation distortion in the output signal is less than a predetermined level of intermodulation distortion and second value when the level of intermodulation distortion in the output signal is greater than or equal to the predetermined level of intermodulation distortion. A second monitoring circuit is coupled to the output signal and generates a second control signal based on a power level of the output signal. The second control signal controls a level of the input RF signal so that the power level of the output signal is less than a predetermined power level. A phase shift/hybrid network is coupled to a primary signal path and an auxiliary signal path of the power amplifier. The phase shift/hybrid network receives an input RF signal, and is responsive to the first control signal by generating only a first signal that is coupled to the primary signal path when the first control signal has the first value, and by generating the first signal and a second signal that are respectively coupled to the primary signal path and the auxiliary signal path when the first control signal has the second value.

8 Claims, 3 Drawing Sheets

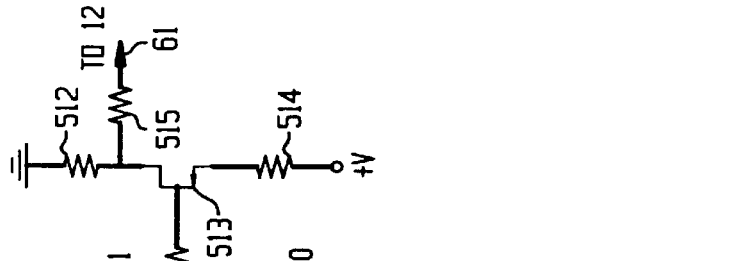
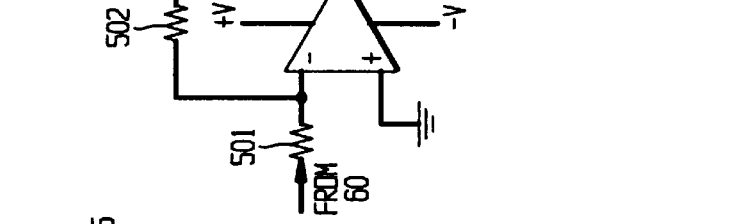
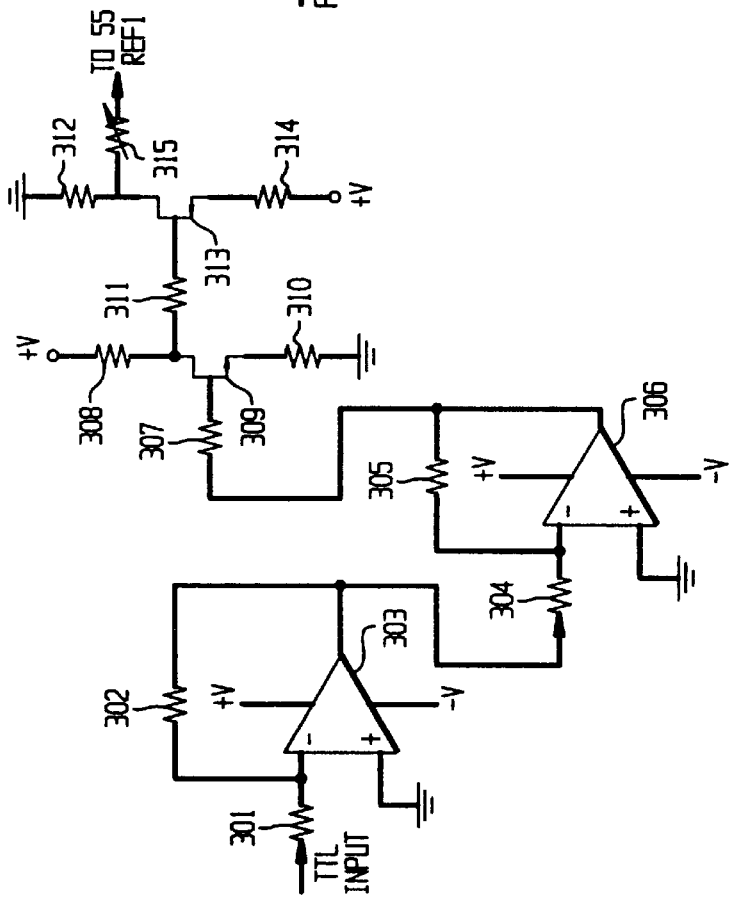
FIG. 5
FIG. 4

6,066,983

PCS MULTI-CARRIER LINEAR POWER AMPLIFIER

BACKGROUND OF THE INVENTION

1. Field of the Invention

The present invention relates to the field of radios. More particularly, the present invention relates to a system providing a highly-linear, high-frequency power amplifier having low intermodulation products.

2. Description of the Related Art

Highly-linear, high-frequency power amplifiers that are used for multi-carrier code division multiple access (CDMA) and orthogonal frequency division multiplexing (OFDM) applications are a design challenge. Power amplifier nonlinearities generate intermodulation distortion products, and AM/AM and AM/PM distortions that result in co-channel interference and system self-jamming. Conventional techniques for overcoming amplifier nonlinearities include feedback and feed-forward techniques, predistortion and cascaded amplification. Feed-forward techniques have been used extensively, but provide inefficient performance and operation (less than 10% efficient). Additionally, feed-forward techniques require numerous circuit components and bulky delay lines that are inflexible once a design complete. Another approach is to connect multiple transistors in a parallel configuration at the output stage of a power amplifier so that each transistor operates with linear characteristics.

Nevertheless, what is needed is a linear RF power amplifier having a selectable output power level and a low intermodulation distortion level.

SUMMARY OF THE INVENTION

The present invention provides a linear RF power amplifier having a selectable output power level and a low intermodulation distortion level. The advantages of the present invention are provided by an RF power amplifier that includes a first monitoring circuit that is coupled to an output signal of the amplifier, and which generates a first control signal based on a level of intermodulation distortion in the output signal. The first control signal has a first value when the level of intermodulation distortion in the output signal is less than a predetermined level of intermodulation distortion and second value when the level of intermodulation distortion in the output signal is greater than or equal to the predetermined level of intermodulation distortion. A second monitoring circuit is coupled to the output signal and generates a second control signal based on a power level of the output signal. The second control signal controls a level of the input RF signal so that the power level of the output signal is less than a predetermined power level.

According to the invention, a phase shift/hybrid network is coupled to a primary signal path and an auxiliary signal path of the amplifier. The phase shift/hybrid network receives an input RF signal, such as a multi-carrier RF signal, and is responsive to the first control signal by generating only the first signal when the first control signal has the first value and by generating the first and second signal when the first control signal has the second value. The phase shift/hybrid network includes a 90° hybrid network, first and second switches, and first and second 180° phase shifters. The 90° hybrid network has first, second, third and fourth ports, with the first port receiving the input RF signal. The first switch has first and second terminals, such that the first terminal of the first switch is coupled to the second port of the 90° hybrid network. Similarly, the second switch has first and second terminals, with the first terminal of the second switch being coupled to the third port of the 90° hybrid network. The first 180° phase shifter is coupled between the second terminal of the first switch and a signal common. Likewise, the second 180° phase shifter is coupled between the second terminal of the second switch and the signal common.

When the first control signal is the first value, the first and second switches are conductive, the first 180° phase shifter shorts the second terminal of the first switch to the signal common, the second 180° phase shifter shorts the second terminal of the second switch to the signal common, and the first signal is output from the fourth port of the 90° hybrid network. When the first control signal is the second value, the first and second switches are non-conductive, the first and second 180° phase shifters are non-conductive, the first signal is output from the third port of the 90° hybrid network and the second signal is output from the second port of the 90° hybrid network.

BRIEF DESCRIPTION OF THE DRAWING

The present invention is illustrated by way of example and is not limited by the accompanying figures in which like reference numerals indicate similar elements and in which:

FIG. 4 is a schematic diagram for an exemplary reference generator circuit according to the present invention; and FIG. 5 is a schematic diagram for an exemplary modulator circuit according to the present invention.

DETAILED DESCRIPTION

The present invention provides an efficient, highly-linear, high-frequency, multi-carrier power amplifier that is ideal for use in a personal communication system (PCS). The power amplifier of the present invention includes two feedback loops that operate together to provide a selectable intermodulation level and a selectable output power level. A first feedback loop is used for controlling the level of intermodulation products generated by the amplifier. A second feedback loop is used for controlling the output power of the amplifier. The present invention is flexible and provides a wide range of power output that can be tailored to any system requirements without requiring that the power module be redesigned.

Figure 1:
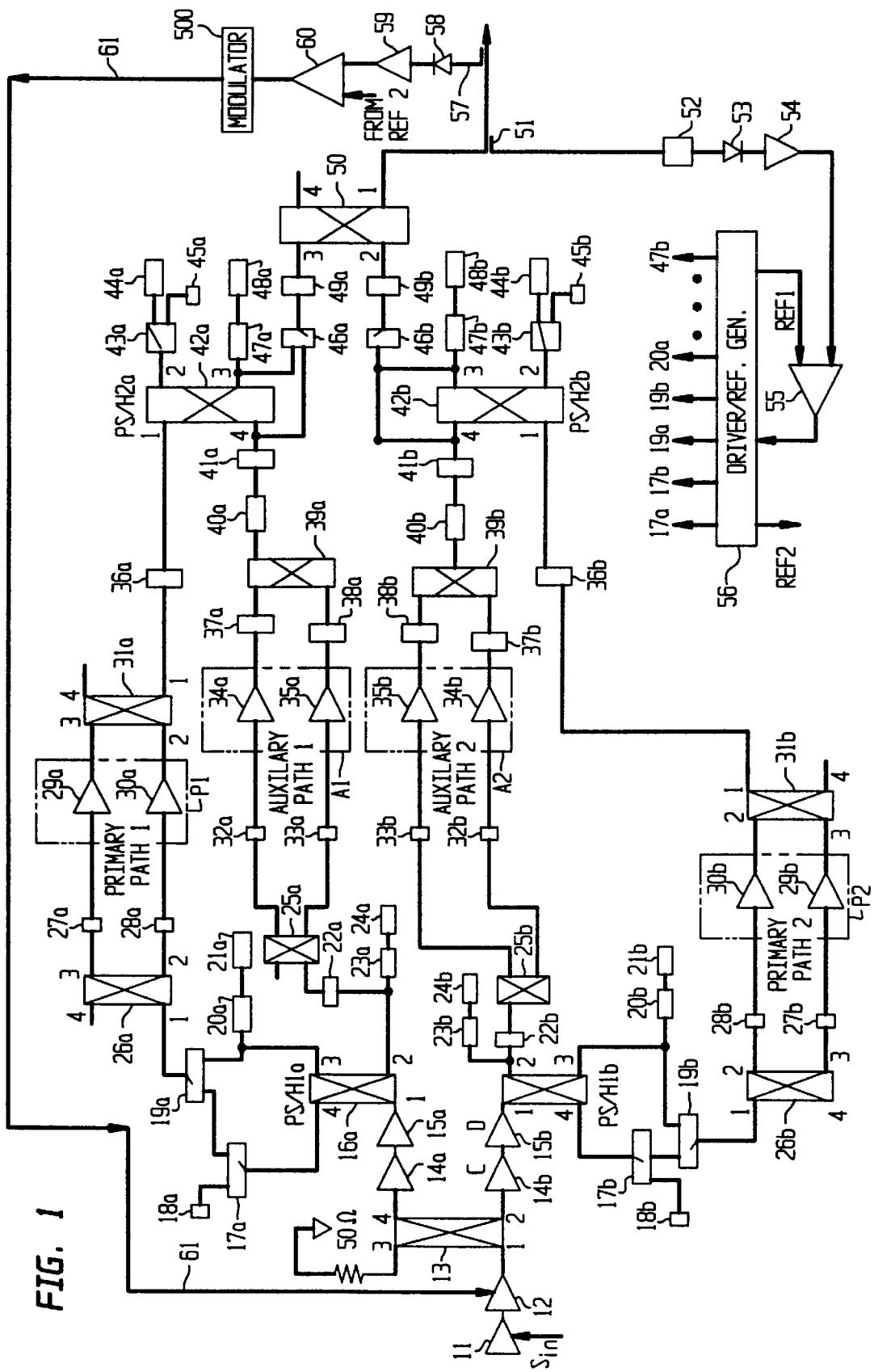
FIG. 1 is a schematic block diagram of an exemplary embodiment of a multi-carrier linear power amplifier according to the present invention.

FIG. 1 is a schematic block diagram of an exemplary embodiment of a multi-carrier linear power amplifier 10 according to the present invention. Two complementary operating modes, referred to herein as mode 1 and mode 2, are the two main modes for amplifier 10. In mode 1, two primary RF power modules P1 and P2 generate the output power of amplifier 10. As the power of the input signal applied to amplifier 10 increases, the level of intermodulation products generated by primary RF power modules P1 and P2 increases accordingly. When the level of intermodulation products exceeds a predetermined threshold, mode 2 is initiated and the output power of amplifier 10 is generated by primary RF power modules P1 and P2 plus two auxiliary RF power modules A1 and A2. Amplifier 10 is also capable of a third, secondary mode of operation (mode 3) in which primary RF power modules P1 and P2 and one auxiliary RE module (A1 or A2) are used for generating the output power.

Figure 2:
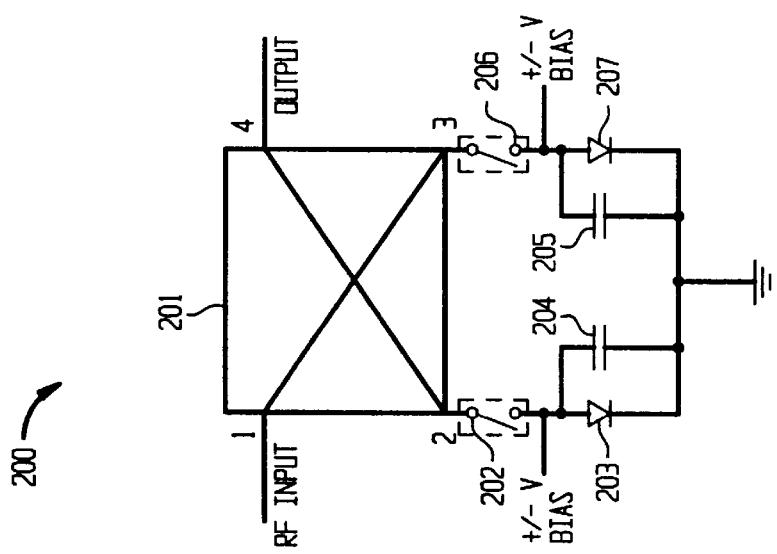
FIG. 2 is a schematic diagram for the basic configuration of a phase shifter/hybrid network according to the present invention.

The key component enabling amplifier 10 to shift between mode 1 and mode 2 is a phase shifter/hybrid (PS/H) network. FIG. 2 shows a schematic block diagram of a basic configuration of a PS/H network 200 according to the present invention. PS/H network 200 includes a 90° hybrid network 201, two switches 202 and 206, two 180° phase shifters 203 and 207, and two capacitors 204 and 205. Preferably, phase shifters 203 and 207 are shunt high-power PIN diodes. Capacitors 204 and 205 ensure that pin diodes 203 and 207 are resistively close to zero for reducing insertion loss. A PS/H network according to the present invention, as incorporated into amplifier 10, is shown in FIG. 1 as PS/H 1a and includes hybrid network 16a, switches 20a and 23a, and 180° phase shifters 21a and 24a.

Again referring to FIG. 2, an RF signal applied to port 1 of hybrid network 201, the RF signal is split into two and is output from ports 2 and 3. When a bias voltage +v is applied to switches 202 and 206, and to phase shifters 203 and 207, network 200 operates like a 180° phase shifter. The RF signal "sees" a short to signal common at output ports 2 and 3, and is completely reflected to isolated port 4 of hybrid network 201. Typical insertion loss is in the range of 0.5 dB to 1 dB. When a bias voltage −v is applied to switches 202 and 206, and to phase shifters 203 and 207, hybrid network 201 operates as a power divider and the input RF signal is output from ports 2 and 3 of hybrid network 201.

Referring now to FIG. 1, amplifier 10 has two primary RF power modules P1 and P2. In mode 1, an input Sin signal applied to amplifier 10 is power divided and applied to RF power modules P1 and P2 through primary paths 1 and 2. The outputs of modules P1 and P2 are combined and monitored for intermodulation products and output power level before being output as $S_{out}$. In mode 2, the power-divided signal applied to each primary path is further power-divided before being applied to the primary path and an auxiliary path. That is, the signal applied to primary path 1 for mode 1 operation is further power divided and applied to primary path 1 and auxiliary path 1 for mode 2 operation. Similarly, the signal applied to primary path 2 for mode 1 operation is further power divided and applied to primary path 2 and auxiliary path 2 for mode 2 operation.

By converting from mode 1 to mode 2, additional transistors are introduced at the output stage with a corresponding lowering of the drive signal applied to each transistor thereby reducing the output intermodulation distortion and providing improved efficiency.

Primary path 1 and primary path 2 have similar components, as do auxiliary path 1 and auxiliary path 2. Consequently, the following detailed description of the present invention focuses on the operation of only primary path 1 and auxiliary path 1. It should be understood that primary path 2 respectively and auxiliary path 2 operate in a manner similar to primary path 1 and auxiliary path 2.

In FIG. 1, an input signal $S_{in}$ applied to amplifier 10 is amplified and buffered by a first amplifier stage 11. The output of first amplifier stage 11 is applied to a second amplifier stage 12 that has an adjustable gain under control of a control signal 61. The output of amplifier stage 12 is applied to port 1 of a hybrid network 13 that operates as a power divider. The signal output from port 3 of hybrid network 13 is applied to primary path 1, and the signal output from port 2 is applied to primary path 2. Port 4 is terminated in 50 Ohms. The signal output from port 3 is amplified by a third amplifier stage 14a and a fourth amplifier stage 15a. The output of amplifier stage 15a is applied to port 1 of a phase shifter/hybrid (PS/H) network 1a that includes hybrid network 16a, switches 20a and 23a, and 180° phase shifters 21a and 24a. Capacitors 204 and 205, which are shown in FIG. 2, are not shown in FIG. 1 for simplicity.

In mode 1, switches 20a and 23a are biased to be conducting and phase shifters 21a and 24a are biased to be shorted to signal common. Switch 17a is configured to conduct between port 4 of hybrid network 16a and a switch 19a. Switch 22a is biased to be non-conducting. PS/H 1a operates as a 180° phase shifter, and all of the signal energy applied to port 1 of hybrid network 16a is reflected and appears at port 4 of hybrid network 16a with a maximum power loss of 0.5 dB to 1 dB. The signal output from port 4 of hybrid network 16a passes through switch 17a to switch 19a. Switch 19a is configured to conduct the signal from switch 17a to port 1 of a hybrid network 26a.

Hybrid network 26a operates as a power divider. The signals appearing at ports 2 and 3 of hybrid network 26a respectively pass through attenuators 27a and 28a before being amplified by RF power module P1. Specifically, the signal output from port 3 of hybrid network 26a is attenuated by attenuator 27a and then amplified by RF power amplifier 29a. The signal output from port 2 of hybrid network 26a is attenuated by attenuator 28a and then amplified by RF power amplifier 30a. The output signals of RF power module P1 are combined by a hybrid network 31a. The output of hybrid network 31a is phase shifted by phase shifter 36a before being applied to a PS/H network 2a that includes hybrid network 42a, switches 43a, 46a and 47a, 180° phase shifters 44a and 48a and termination 45a.

Switch 43a is configured in mode 1 to be conducting and connected to phase shifter 44a. Switch 47a is also biased to be conducting. Phase shifters 44a and 48a are biased to be shorted to signal common. Consequently, all of the signal energy applied to port 1 of hybrid network 42a is reflected and appears at port 4 of hybrid network 42a with a maximum power loss of 0.5 dB to 1 dB. A switch 41a that is coupled to port 4 of hybrid network 42a is biased to be non-conducting. A switch 46a that is also coupled to port 4 of hybrid network 42a is biased so that port 4 of hybrid network 42a is connected to a phase shifter 49a. The output of phase shifter 49a is coupled to port 1 of a hybrid network 50 so that the signal output from port 4 of hybrid network 42a passes through switch 46a and phase shifter 49a to port 1 of hybrid network 50.

Port 2 of hybrid network 50 receives a signal that has been power amplified by RF power module P2 along a similar path. Hybrid network 50 combines the signals respectively amplified by RF power modules P1 and P2. The combined output signal, appearing at port 1 of hybrid network 50, passes through a directional coupler 51. Coupler 51 couples a portion of the combined output signal to a band-rejection or notch filter 52 that removes the main carrier frequency signal, thereby leaving the intermodulation distortion signal that is generated by power modules P1 and P2. The intermodulation distortion signal is detected by a detector 53. An amplifier 54 amplifies the output of detector 53 so that the detected intermodulation distortion signal can be compared to a reference signal Ref1 by a comparator 55. Reference signal Ref1 is selected to represent a desired level of intermodulation distortion that amplifier 10 is not to exceed. The output of comparator 55 is coupled to a switch driver/ reference generator circuit 56 that generates all the bias control signals for the switches shown in FIG. 1.

Figure 3:
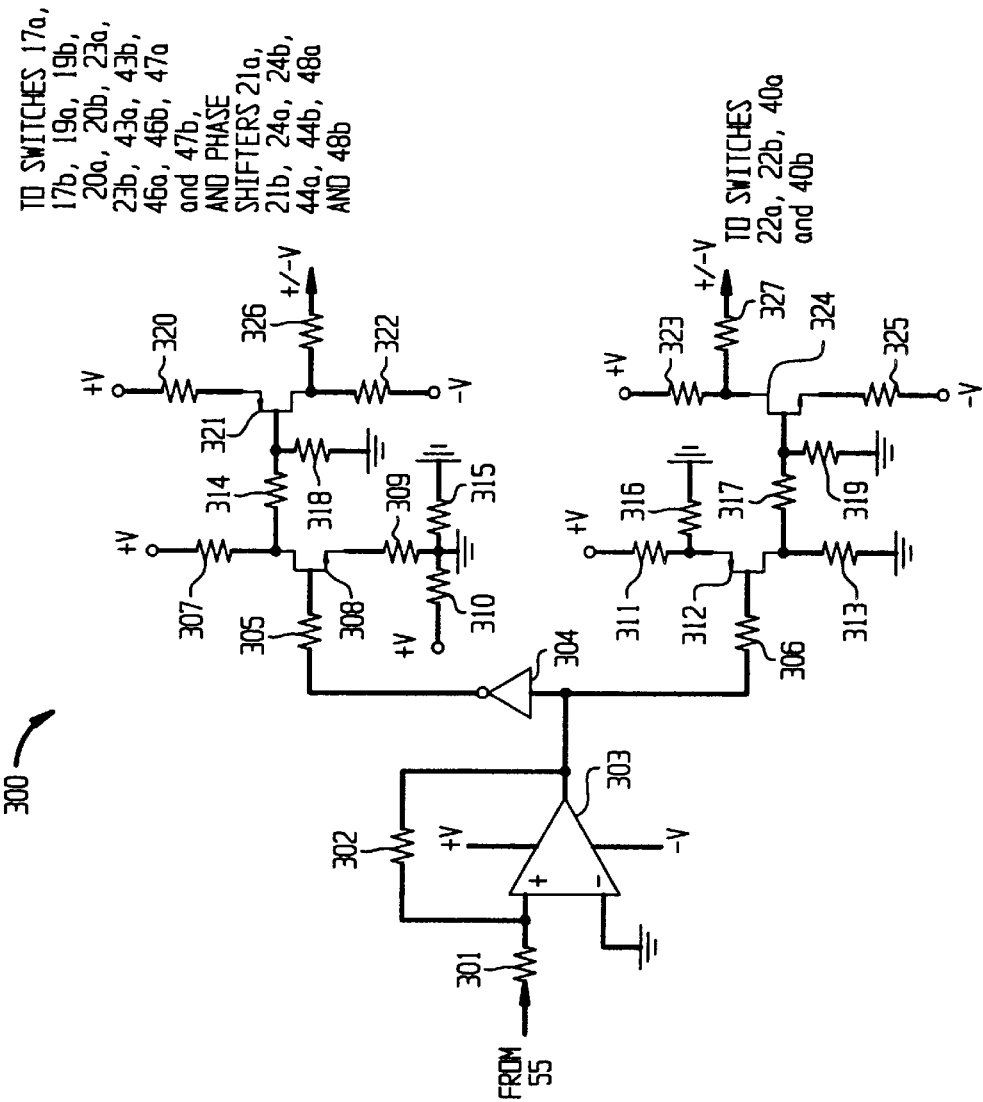
FIG. 3 is a schematic diagram for an exemplary switch driver circuit according to the present invention.

FIG. 3 shows a schematic diagram for an exemplary switch driver circuit 300 and FIG. 4 is a schematic diagram for a reference generator circuit 400. Both circuit 300 and circuit 400 are part of switch driver/reference generator circuit 56.

Switch driver circuit 300 has two complementary outputs that bias the switches and the phase shifters. The first output biases switches 17a, 17b, 19a, 19b, 20a, 20b, 23a, 23b, 43a, 43b, 46a, 46b, 47a and 47b, and phase shifters 21a, 21b, 24a, 24b, 44a, 44b, 48a and 48b. The second output biases switches 22a, 22b, 40a and 40b.

Switch driver circuit 300 includes an amplifier 303 that is configured to be non-inverting. Amplifier 303 amplifies and buffers the signal output from comparator 55. Resistors 301 and 302 set the gain of amplifier 303 in a well-known manner. The output of amplifier 303 drives an inverter 304 and a transistor 312 through a resistor 306. The output of inverter 304 drives the first output through transistors 308 and 321. Transistor 312 drives the second output through transistor 324.

In mode 1, the output of comparator 55 is a first value (representing a logic 0, for example) indicating that the level of intermodulation distortion appearing in the output signal is less than the threshold set by Ref1. Amplifier 303 amplifies and buffers the output of comparator 55. Inverter 304 inverts the output of amplifier 303. The output of inverter 304 is applied to npn transistor 308 through a resistor 305. Transistor 308 turns on and the collector of transistor 308 goes low. The collector of transistor 308 is connected to the base of pnp transistor 321 through a resistor network formed by resistors 314 and 318. When the collector of transistor 308 goes low, the collector of transistor 321 goes high. Resistors 307, 309, 310, 315, 320 and 322 and supply voltages +v and −v bias transistors 308 and 321 in a well-known manner.

The output of amplifier 303 also drives a pnp transistor 312 through a resistor 306. When amplifier 303 is low, the collector of transistor 312 goes high. The collector of transistor 312 is connected to the base of an npn transistor 324 through a resistor network formed by resistors 317 and 319. When the collector of transistor 312 goes high, the collector of transistor 324 goes low. Resistors 311, 313, 316, 323, and 325 and supply voltages +v and −v bias transistors 312 and 324 in a well-known manner.

Thus, in mode 1, switches 17a, 17b, 19a, 19b, 20a, 20b, 23a, 23b, 43a, 43b, 46a, 46b, 47a and 47b are biased to be conducting and phase shifters 21a, 21b, 24a, 24b, 44a, 44b, 48a and 48b are biased to be on. Simultaneously, switches 22a, 22b, 40a and 40b are biased to be non-conducting.

When the intermodulation distortion level in the output of amplifier 10 exceeds the threshold Ref1, the output of comparator 55 becomes a second value (representing a logic 1, for example) and amplifier 10 enters mode 2. Non-inverting amplifier 303 amplifies and buffers the output of comparator 55. Inverter D1 inverts the output of amplifier 303, thereby biasing switches 17a, 17b, 19a, 19b, 20a, 20b, 23a, 23b, 43a, 43b, 46a, 46b, 47a and 47b to be non-conducting and biasing phase shifters 21a, 21b, 24a, 24b, 44a, 44b, 48a and 48b to be off. Simultaneously, switches 22a, 22b, 40a and 40b are biased to be conducting.

When amplifier 10 converts from mode 1 to mode 2, the input level applied to primary path 1 is reduced by as much 4 dB. For an input power of +10 dBm, for example, the output power can vary from +53 dBm (200 watts linear power) to +57 dBm (500 watts P1dB). If an 8 to 12 dB peak-to-average envelope power, as required for CDMA and OFDM signaling, is considered, the operating output power is in the range of 20 to 80 watts linear power and the level of the intermodulation distortion rejection will be in the range of 50 to 70 dB. At an output power of 80 watts linear power, efficiency of amplifier 10 is approximately 16% to 20%, which is twice the efficiency of a conventional feed-forward approach of less than 10%. Conversion to mode 3 is similar to conversion to mode 2, but only one auxiliary power module is used in conjunction with primary power modules P1 and P2.

FIG. 4 shows is a schematic diagram for an exemplary reference generator circuit 400 that generates reference signal Ref1. Switch driver/reference generator circuit 56 includes yet another reference generating circuit for generating Ref2, but is not shown in FIG. 4 because a circuit similar to circuit 300 can be used. Reference generator circuit 400 includes an inverting amplifier 403 and an inverting amplifier 406. Resistors 401 and 402 set the gain of amplifier 403 in a well-known manner. Similarly, resistors 404 and 405 set the gain of amplifier 406 in a well-known manner. The output of amplifier 403 drives amplifier 406. The output of amplifier 406 is connected to the base of an npn transistor 409. The collector of transistor 409 is connected to the base of a pnp transistor 413 through a resistor 411. The signal Ref1 is output to comparator 55 through a variable resistor 415. Resistors 408, 410, 412 and 414, and supply voltages +v and −v bias transistors 409 and 413 in a well-known manner.

Again referring to FIG. 1, switches 20a and 23a and phase shifters 21a and 24a are biased off during mode 2 so that PS/H 1a operates like a power splitter or combiner. Switch 17a is configured to connect termination 18a to port 4 of hybrid network 16a. Additionally, switches 22a and 22b are conducting. The input power applied to port 1 of hybrid network 13 is divided and distributed to both the primary and auxiliary signal paths, thereby increasing the number of transistors operating at the output of amplifier 10 and lowering the level of intermodulation distortion generated by amplifier 10.

The combined output signal of amplifier 10 also passes through a directional coupler 57 before being output. Directional coupler 57 couples a portion of the combined output signal to a detector 58. An amplifier 59 amplifies the signal detected by detector 58 for comparison to a reference signal Ref2 by a comparator 60. Reference signal Ref2 represents a desired power level output by amplifier 10. The output of comparator 60 is coupled to a modulator generator circuit 500 that generates a control signal 61 that is output to amplifier 12 for controlling the signal level applied to port 1 of hybrid network 13. When the output power is greater than the desired output, modulator circuit 500 adjusts the gain of amplifier stage 12 to reduce the input level and vice-versa through control signal 61. Ref2 can be adjusted for any desired output power within the transistors specifications.

FIG. 5 shows a schematic diagram for an exemplary modulator circuit 500. Modulator circuit 500 includes an amplifier 503 and an amplifier 506. Both amplifiers 503 and 506 are configured to be inverting amplifiers. Resistors 501 and 502 set the gain of amplifier 503 in a well-known manner. Similarly, resistors 504 and 505 set the gain of amplifier 506 in a well-known manner. The output of amplifier 503 is input to amplifier 506. The output of amplifier 506 is connected to the base of an npn transistor 509. The collector of transistor 509 is connected to the base of a pnp transistor 513 through a resistor 511. The output of circuit 500 is output to amplifier stage 12, which is output as control signal 61 and is used for controlling the signal level applied to port 1 of hybrid network 13 through a resistor 515. Resistors 508, 510, 512 and 514, and power supply voltages +v and −v bias transistors 509 and 513 in a well-known manner.

Most of the components of amplifier 10 are passive and small, so the overall size of amplifier 10 is determined primarily by the number of output transistors. Phase shifters 36a, 36b, 37a, 37b, 38a, 38b, 41a, 41b, 49a and 49b are preferably formed by printed pads on a printed circuit board and are used for amplitude and phase trimming. Implementation using mulitlayer construction can reduce fabrication cost.

While the present invention has been described in connection with the illustrated embodiments, it will be appreciated and understood that modifications may be made without departing from the true spirit and scope of the invention.

What is claimed is:

1. An RF power amplifier, comprising:
    a primary signal path receiving a first signal and amplifying the first signal to a first power level;
    an auxiliary signal path receiving a second signal and amplifying the second signal to a second power level;
    a combiner network coupled to the primary signal and the auxiliary signal path, the combiner network generating an output signal;
    a first monitoring circuit coupled to the output signal, the first monitoring circuit generating a first control signal based on a level of intermodulation distortion in the output signal, the first control signal having a first value when the level of intermodulation distortion in the output signal is less than a predetermined level of intermodulation distortion and having a second value when the level of intermodulation distortion in the output signal is greater than or equal to the predetermined level of intermodulation distortion;
    a phase shift/hybrid network coupled to the primary signal path and the auxiliary signal path, the phase shift/hybrid network receiving an input RF signal and being responsive to the first control signal by generating only the first signal when the first control signal has the first value and by generating the first and second signal when the first control signal has the second value; and
    a second monitoring circuit coupled to the output signal, the second monitoring circuit generating a second control signal based on a power level of the output signal, the second control signal controlling a level of the input RF signal so that the power level of the output signal is less than a predetermined power level.

2. The RF power amplifier according to claim 1, wherein the phase shift/hybrid network includes,
    a 90° hybrid network having first, second, third and fourth ports, the first port receiving the input RF signal;
    a first switch having first and second terminals, the first terminal of the first switch being coupled to the second port of the 90° hybrid network;
    a second switch having first and second terminals, the first terminal of the second switch being coupled to the third port of the 90° hybrid network;
    a first 180° phase shifter coupled between the second terminal of the first switch and a signal common; and
    a second 180° phase shifter coupled between the second terminal of the second switch and the signal common,
    the first and second switches being responsive to the first value of the first control signal by being conductive, the first 180° phase shifter being responsive to the first value of the control signal by shorting the second terminal of the first switch to the signal common, the second 180° phase shifter being responsive to the first value of the control signal by shorting the second terminal of the second switch to the signal common, and the first signal being output from the fourth port of the 90° hybrid network, and the first and second switches being responsive to the second value of the first control signal by being non-conductive, the first 180° phase shifter being responsive to the second value of the first control signal by being non-conductive, the second 180° phase shifter being responsive to the second value of the first control signal by being non-conductive, and the first signal being output from the third port of the 90° hybrid network and the second signal being output from the second port of the 90° hybrid network.

3. The RF power amplifier according to claim 2, wherein the first monitoring circuit includes,
    a notch filter passing an intermodulation distortion signal in the output signal;
    a distortion detector circuit detecting the intermodulation distortion signal; and
    a distortion level comparator circuit comparing the detected intermodulation distortion signal to a first threshold level, the distortion level comparator circuit generating the first control signal based on a level of the detected intermodulation distortion signal with respect to the first threshold level.

4. The RF power amplifier according to claim 3, wherein the distortion level comparator circuit includes a switch driver circuit generating the first control signal.

5. The RF power amplifier according to claim 3, wherein the second monitoring circuit includes,
    a detector circuit detecting a power level of the output signal; and
    a power level comparator circuit generating the second control signal based on the detected power level of the output signal.

6. The RF power amplifier according to claim 5, wherein the power level comparator includes a modulator circuit generating the second control signal.

7. The RF power amplifier according to claim 1, wherein the combiner includes,
    a 90° hybrid network having first, second, third and fourth ports, the first port receiving the input RF signal;
    a first switch having first and second terminals, the first terminal of the first switch being coupled to the second port of the 90° hybrid network;
    a second switch having first and second terminals, the first terminal of the second switch being coupled to the third port of the 90° hybrid network;
    a first 180° phase shifter coupled between the second terminal of the first switch and a signal common; and
    a second 180° phase shifter coupled between the second terminal of the second switch and the signal common,
    the first and second switches being responsive to the first value of the first control signal by being conductive, the first 180° phase shifter being responsive to the first value of the control signal by shorting the second terminal of the first switch to the signal common, the second 180° phase shifter being responsive to the first value of the control signal by shorting the second terminal of the second switch to the signal common, and the first signal being output from the fourth port of the 90° hybrid network, and the first and second switches being responsive to the second value of the first control signal by being non-conductive, the first 180° phase shifter being responsive to the second value of the first control signal by being non-conductive, the second 180° phase shifter being responsive to the second value of the first control signal by being non-conductive, and the first signal being output from the third port of the 90° hybrid network and the second signal being output from the second port of the 90° hybrid network.

8. The RF power amplifier according to claim 1, wherein the input RF signal is a multi-carrier signal.

* * * * *